(12) United States Patent
Marti Canales

(10) Patent No.: US 12,306,230 B2
(45) Date of Patent: May 20, 2025

(54) REFLECTOMETRY SENSING

(71) Applicant: Divirod, Inc., Boulder, CO (US)

(72) Inventor: Antonio Javier Marti Canales, Boulder, CO (US)

(73) Assignee: Divirod, Inc., Boulder, CO (US)

( * ) Notice: Subject to any disclaimer, the term of this patent is extended or adjusted under 35 U.S.C. 154(b) by 0 days.

(21) Appl. No.: 18/336,977

(22) Filed: Jun. 17, 2023

(65) Prior Publication Data

US 2024/0027505 A1    Jan. 25, 2024

Related U.S. Application Data

(62) Division of application No. 17/872,915, filed on Jul. 25, 2022, now Pat. No. 11,719,732.

(51) Int. Cl.
| | | |
|---|---|---|
| *G01R 29/08* | (2006.01) | |
| *H01Q 9/04* | (2006.01) | |
| *H01Q 15/24* | (2006.01) | |
| *H04B 17/15* | (2015.01) | |

(52) U.S. Cl.
CPC ....... *G01R 29/0814* (2013.01); *H01Q 9/0407* (2013.01); *H01Q 15/244* (2013.01); *H04B 17/15* (2015.01)

(58) Field of Classification Search
CPC .. G01R 29/0814; H04B 17/15; H01Q 9/0407; H01Q 15/244; H01Q 3/267; G01S 13/003; G01S 19/32; H04W 72/20
See application file for complete search history.

(56) References Cited

U.S. PATENT DOCUMENTS

| | | | | |
|---|---|---|---|---|
| 4,853,702 A | * | 8/1989 | Shiokawa | H04B 7/10 342/361 |
| 6,252,542 B1 | * | 6/2001 | Sikina | H01Q 3/267 342/174 |
| 2006/0077094 A1 | * | 4/2006 | Eisenstein | G01S 13/003 342/357.31 |
| 2009/0195449 A1 | * | 8/2009 | Bedell | G01S 19/22 342/357.61 |

(Continued)

FOREIGN PATENT DOCUMENTS

| | | | | |
|---|---|---|---|---|
| EP | 1262792 A1 | * | 12/2002 | G01C 13/00 |
| EP | 3249429 A1 | * | 11/2017 | G01S 19/13 |

(Continued)

OTHER PUBLICATIONS

Zaheri et al., "Comparing Detection Performance of Polarization and Spatial Diversity for Indoor GNSS Applications", IEEE, pp. 737-744 (Year: 2010).*

(Continued)

*Primary Examiner* — Michael J Dalbo
*Assistant Examiner* — Kaleria Knox
(74) *Attorney, Agent, or Firm* — NOD Law PC

(57) ABSTRACT

Data receiving and logging are disclosed. A method includes receiving a linearly polarized signal, the linearly polarized signal including a set of direct and reflected components and obtaining power measurements of the linearly polarized signal. The power measurements are inserted into a navigation message and provided as precision power values characterizing the linearly polarized signal at a high precision. The power values for the linearly polarized signal are stored for further analysis.

4 Claims, 6 Drawing Sheets

(56) References Cited

U.S. PATENT DOCUMENTS

2021/0325548 A1* 10/2021 Garin .................. G01S 19/32
2022/0109490 A1* 4/2022 Ma ...................... H04W 72/20

FOREIGN PATENT DOCUMENTS

| EP | 3339904 | | 6/2018 |
|----|---------|---|--------|
| EP | 3627190 | | 3/2020 |
| JP | 2006311050 A | * | 11/2006 |
| WO | WO2021/046635 | | 3/2021 |

OTHER PUBLICATIONS

Gijsels Willem, European Search Report, Dec. 12, 2023, European Patent Office.
Kari Rodriguez, Patent Cooperation Treaty, Written Opinion Of The International Searching Authority, Nov. 8, 2023, Alexandria, Virginia.

\* cited by examiner

Measured
Radiation Pattern

REFLECTOMETRY SENSING

CLAIM OF PRIORITY UNDER 35 U.S.C. § 120

The present Application for Patent is a Divisional of patent application Ser. No. 17/872,915 entitled "REFLECTOMETER SENSOR" filed Jul. 25, 2022, pending, and assigned to the assignee hereof and hereby expressly incorporated by reference herein.

BACKGROUND

Field

The present disclosed embodiments relate generally to sensing technologies, and more specifically to GNSS reflectometry sensing technologies for environmental data collection.

Background

There are many risks associated with water that affect property and public safety. The risks are due to dynamic factors such as, for example, tidal and weather factors that affect the impact of water, or lack thereof, on people and property.

Economic loss and damage from tidal changes, floods, storms, droughts, and rising ocean levels are increasingly making it more difficult to timely and cost-effectively realize planned developments. And existing developments face the same ongoing and increasingly unpredictable risks associated with water.

Existing sensing technologies for obtaining water data suffer in many respects. Some prior technologies are only able to intermittently collect information during certain time periods or under certain weather and water conditions.

Some prior technologies utilize probes that are submerged in water; thus, requiring undesired operational and maintenance attention. In addition, the sampling area of these types of probe deployments is very limited, so sampling a large area requires an extremely large initial investment in a large number of probes.

In the context of soil moisture measurements, some prior technologies utilize probes that are installed in soil columns or other locations that are prone to being submerged in water; thus, requiring undesired operational and maintenance attention. In addition, the sampling area of these types of probe deployments is very limited, so sampling a large area requires an extremely large initial investment in a large number of probes.

Yet other prior sensing technologies employ remote satellite sensing, which provides low resolution data that is often intermittent with high latencies; thus, remote satellite sensing is often unsuitable for closed loop controls or near real-time decision making.

In short, existing sensing technologies have many problems that make it hard to acquire data to manage water risks at scale. Consequently, there is a need for substantially continuous, large area, low latency sensing technology that is relatively low cost to deploy.

SUMMARY

An aspect may be characterized as a method for logging data comprising receiving a linearly polarized signal that includes a set of direct and reflected components, obtaining a power measurement of the linearly polarized signal, inserting the power measurement into a navigation message, and then providing, from the navigation message, a precision power value characterizing the linearly polarized signal at a precision of at least $\frac{1}{10}$ dB. The power value for the linearly polarized signal may then be stored for analysis.

Another aspect may be characterized as a signal logger comprising at least one input port and a receiver configured to receive, via the at least one input port, a linearly polarized signal originating from a satellite. The linearly polarized signal includes a set of direct and reflected components. The receiver is also configured to obtain a power measurement of the linearly polarized signal and then insert the power measurement into a navigation message. A precision power value may be provided from that navigation message that characterizes the linearly polarized signal at a precision of at least $\frac{1}{10}$ dB. The power value for the linearly polarized signal is then stored for analysis.

Yet another aspect may be characterized as a signal logging system comprising a two port antenna configured to receive direct and reflected circularly polarized components originating from a satellite. The antenna is configured to produce a first linearly polarized signal including a set of direct and reflected components and a second linearly polarized signal that is orthogonal to the linearly polarized signal, the second linearly polarized signal including a second set of direct and reflected components. The antenna is configured to collocate a phase center of both the direct and reflected circularly polarized components polarizations inside a 1 $mm^3$ volume and collocate a phase center of both the first linearly polarized signal and the second linearly polarized signal inside a 1 mm3 volume. The system also comprises a first receiver configured to receive the first linearly polarized signal, provide, from the navigation message, a first power value characterizing the linearly polarized signal, and store the power value for the first linearly polarized signal. The system includes a second receiver configured to receive, via the at least one input port, a second linearly polarized signal, the second linearly polarized signal is orthogonal to the linearly polarized signal, the second linearly polarized signal including a second set of direct and reflected components. In addition, the second receiver is configured to provide, from the second navigation message, a second power value characterizing second linearly polarized signal and store the power value for second linearly polarized signal.

Aspects of the antenna may comprise a ground plane and a patch portion; a dielectric portion positioned between the patch portion and the ground plane; and a first element and a second element positioned to be coplanar with the patch portion within a diameter of the patch portion wherein the first and second elements are electrically isolated from the patch portion. The antenna may also comprise a first port coupled to the first element and a second port coupled to the second element, wherein the first element is positioned relative to the second element so that an angle of separation between the first element and the second element is 90 degrees.

Another aspect of some antennas is a diameter of the patch portion is less than a diameter of the dielectric portion and the first element and second element are positioned proximate to an outer diameter of the patch portion.

DETAILED DESCRIPTION

The word "exemplary" is used herein to mean "serving as an example, instance, or illustration." Any embodiment described herein as "exemplary" is not necessarily to be construed as preferred or advantageous over other embodiments.

Technology Overview

Aspects of the sensing technology described herein enable measurements that provide water insights affecting assets, investments, and public safety. For example, critical water data may be retrieved at locations of economic interest that are, or can be, affected by tidal changes, floods, storms, and droughts. Sensors described herein measure anything that contains water, or the lack of it, and as a consequence, data obtained and recorded may be indicative of terrain profiles and surface water levels, which are key information for different commercial use cases.

Figure 1:
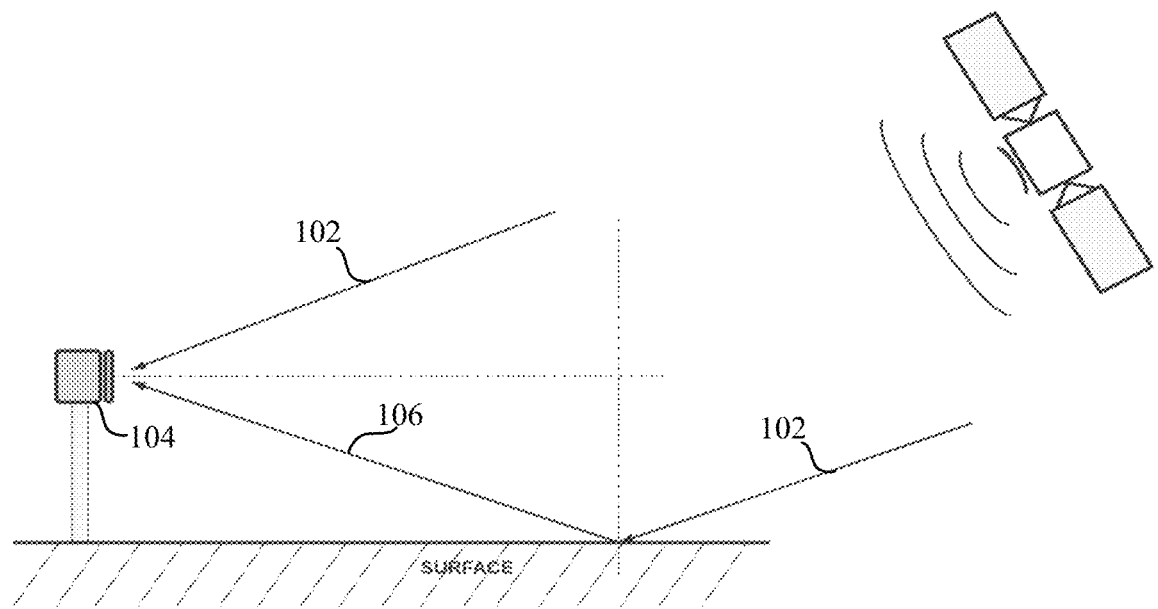
FIG. 1 is a drawing depicting aspects of GNSS reflectometry.

Referring to FIG. 1, shown is an environment in which embodiments of the disclosed sensing technology may be deployed. Aspects of the sensing technology are based on the principles of bi-static radar and, in particular, methodologies known as global navigation system (GNSS) reflectometry. A radar system is formed with available constellations of navigation satellites acting as transmitters of right hand circularly polarized signals 102 and the disclosed sensors acting as receivers for a GNSS reflectometer 104. At any given time, there are approximately twenty of these satellites in the visible sky at any location in the world. The sensors disclosed herein pick up the reflected energy that bounces off the ground in addition to the direct signal from the satellite. The combination of the direct and reflected signals contain unique physical properties (i.e., radar signatures) that may be further processed to produce very precise maps of water across the area covered by our sensors.

Using this technology, temporal data types may be retrieved such as water levels over rivers and reservoirs, tidal changes, wave activity, soil moisture, ice, and snow volume distributions. The data types may be used to derived key insights for commercial applications.

In deployment, the sensors disclosed herein may be installed at a certain height from the ground. The higher the sensor, the larger the area that can be covered. Typical installations are on rooftops, light poles or other existing or new infrastructure and cover an area of several acres with meter range pixels and, when reflecting on surfaces different than liquid water, down to a depth of approximately 40 centimeters. Beneficially, sensors disclosed herein may consume an average of less than 2 W of power sourced from, e.g., a 110V or 220V outlet, or a solar panel and battery. The data retrieved may then be uploaded to the cloud periodically via, e.g., a cellular network.

The data may be processed to provide time-stamped and geo-localized current and forecast information that is delivered, e.g., via dashboards and/or APIs. In addition, reporting and warning/alarms may be provided in case of water risks, e.g., drought, flooding events, snow pack (e.g., including water content equivalent), ice presence, etc. Other derived data services may include anomaly detection (e.g., broken water pipes on distribution or irrigation systems), terrain topology and hydrology.

The Radar Concept

Transmitted Signals:

The GNSS satellites transmit right hand circularly polarized signals 102 in the navigation band extending from 1.575 GHz to 1.62 GHz. These signals travel through space and reach the Earth surface. When the transmitted signals 102 bounce off a surface, the polarization undergoes a 90-degree phase change converting the right hand circular polarization signal 102 to a left hand circularly polarized signal 106. In other words, direct and reflected components are received as circularly polarized components at the antenna 210 where the direct and reflected circularly polarized components originate from a satellite.

Received Signals:

The sensors disclosed herein simultaneously receive two signals (a direct, right hand circularly polarized (RHCP) signal 102 and a reflected, left hand circularly polarized signal (LHCP) 106) from any given satellite, which combine into an interference signal. As discussed further herein, the antenna 210 converts the circularly polarized components into a linearly polarized signal and a second linearly polarized signal.

In many embodiments, a single antenna design to receive simultaneously RHCP and LHCP signals is not practical.

Because circularly polarized signals can be decomposed into two orthogonal, linearly polarized signals while preserving the power from the source signal, the disclosed sensors have as been designed with one or more of the following characteristics:

Capability of measuring two orthogonal, linear polarizations simultaneously;

Ultra-high polarization isolation;

Highly symmetrical radiation pattern, i.e., antenna gain pattern;

Phase center of both polarizations is co-located inside a small (e.g., one millimeter) cube;

Tuned to the GNSS frequencies and bandwidth; and

Materials are selected to survive in outdoor applications (long term temperature and UV resistant)

Figure 2:
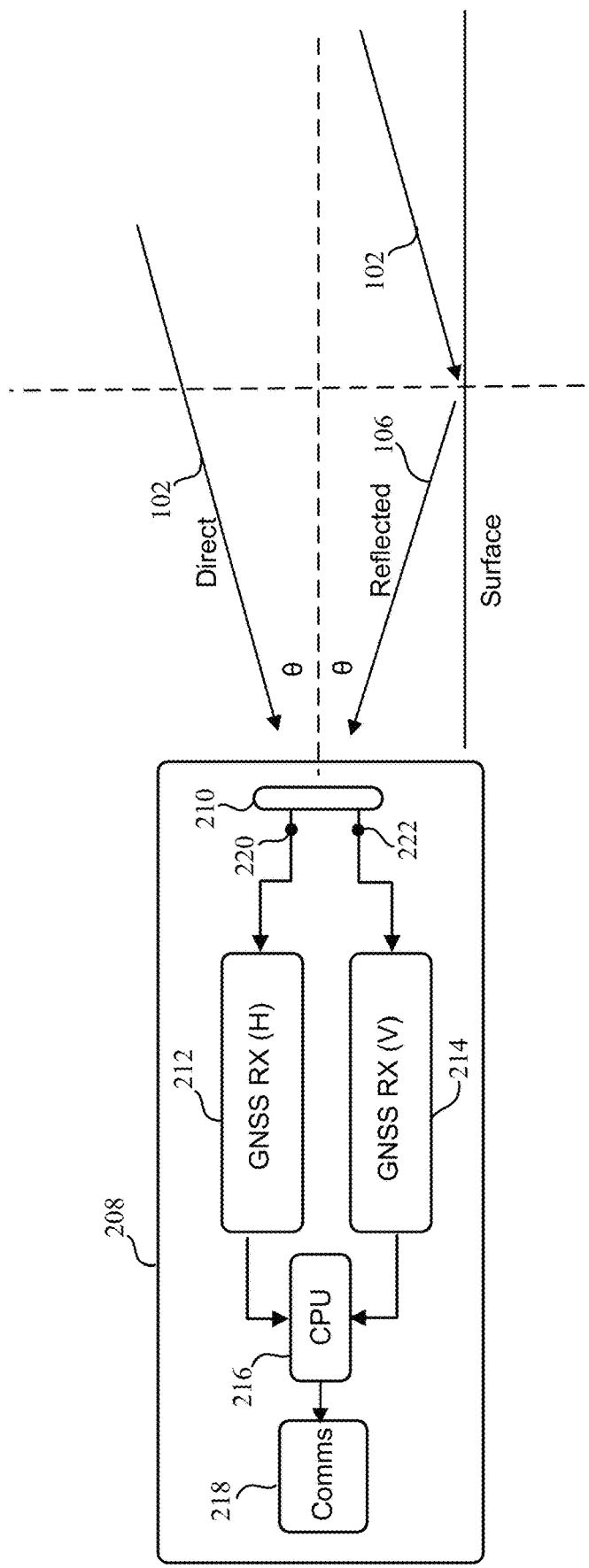
FIG. 2 is a block diagram depicting an example of a GNSS sensor.

Referring to FIG. 2, shown is a block diagram depicting an example sensor 208 (also referred to herein as a signal logging system). As shown, the sensor 208 comprises an antenna 210 that is coupled to a first GNSS receiver chain 212 and a second GNSS receiver chain 214 (also revered to as receivers), which are coupled to a CPU 216, and the CPU 216 is coupled to a communications module 218. Although the antenna 210 is shown as being integrated with the sensor 208, this is certainly not required and the antenna 210 may be a separate, detachable component from the sensor 208. When the antenna 210 is implemented separately, the sensor 208 may be referred to as a signal logger. Those of ordinary skill in the art, in view of this disclosure, will realize that the components of the sensor 208 may be realized in many different ways. For example, the GNSS receiver chains 212, 214 may be custom-designed components implemented by hardware or hardware in connection with software. As another example, commercial off the shelf GNSS receiver chains are available that may be programmed to operate with improved functionality so as to create specific-purpose receiver chains.

Figure 3:
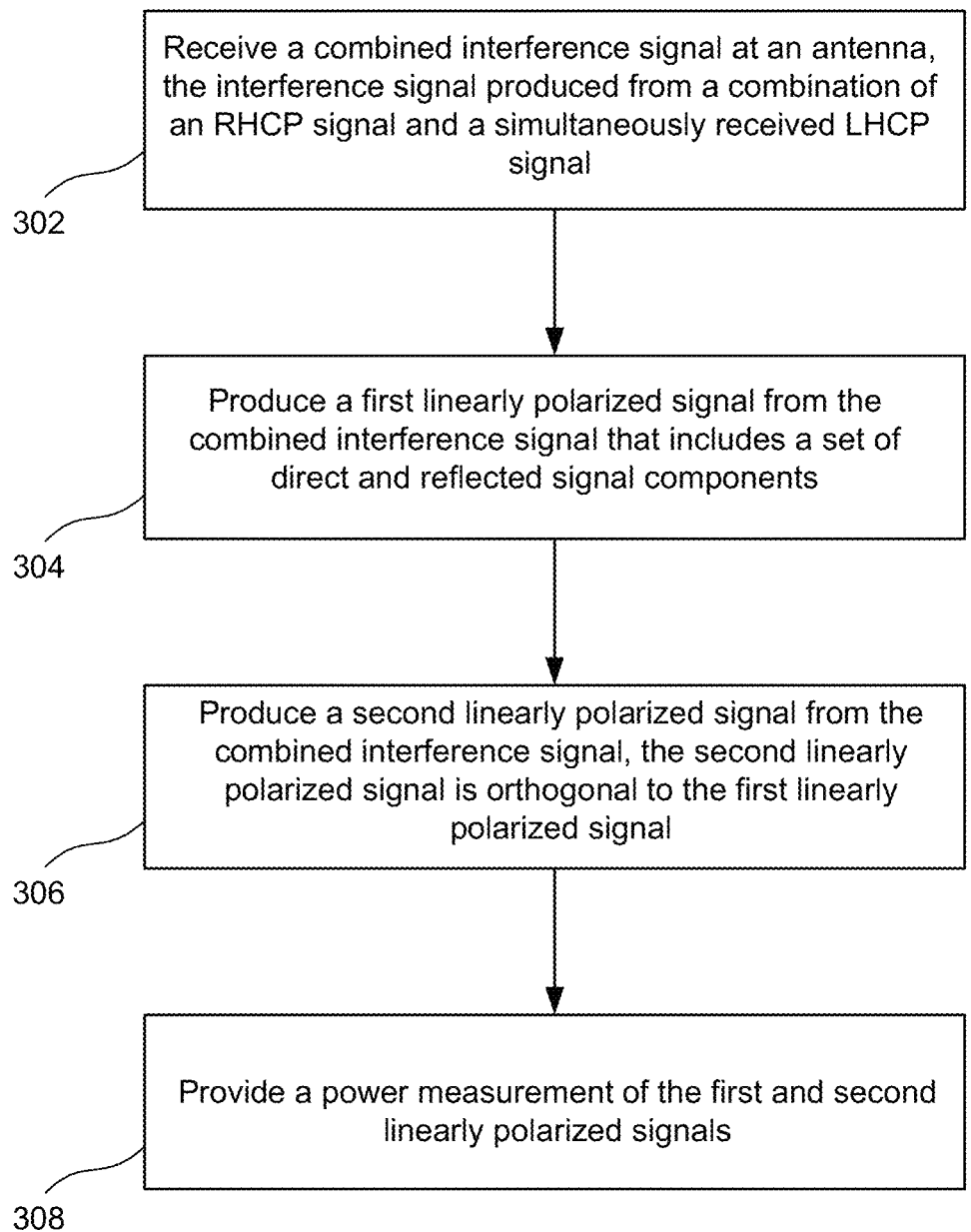
FIG. 3 is a flowchart depicting a method that may be traversed in connection with the sensor depicted in FIG. 2.

While referring to FIG. 2 simultaneous reference is made to FIG. 3, which depicts a method that may be traversed in connection with the embodiments disclosed herein. As shown, the interference signal, produced from the combination of the simultaneously received RHCP signal 102 and the LHCP signal 106, is received at the antenna 210 (Block 302). The power of the interference signal is: Power_antenna (RHCP, LHCP)=Power_direct (mostly RHCP)+Power_reflected (mostly LHCP).

"Mostly" is used here because no antenna has a perfect polarization purity, but most of the power lies in one polarization, and some level of residual signal is on the orthogonal polarization depending on the antenna design.

The direct signal 102 and reflected signal 106 have orthogonal circular polarizations; therefore, the power of the two signals do not add up together and an interference power pattern cannot be derived as a combination of both circular polarizations. As a consequence, many embodiments of the antenna 210 include, as described further herein with reference to FIG. 4, two ports that are arranged to produce two linearly polarized signals that are orthogonal. In addition, there are physical phenomena in the reflected signals that manifest distinctly in linearly polarized signals, providing a richer insight into the observable aspects under study.

As a consequence, the antenna 210 generally functions as a device that captures and delivers (through a first port 220 and a second port 222) the power of the combined signals (the direct signal 102 and the reflected signal 106) as projections into two orthogonal, linear polarizations, referred to here as H (horizontal) and V (vertical). The first port 220 and a second port 222 are also referred to as input ports from a perspective of the first and second GNSS receiver chains 212, 214.

The incident power (IncidentPower_antenna) of the combined signal at the antenna 210 is: IncidentPower_antenna (H,V,θ)=Power_direct (H,V,θ)+Power_reflected (H,V,θ). This combination produces the sought-after interference combination of direct and reflected power for GNSS reflectometry projected in the two orthogonal linearly polarized components, which are the ultra-high polarization isolation and phase center co-location condition of the antenna 210.

The power at each of the first port 220 and the second port 222 of the antenna 210 is given by:

Power_measured (θ)=
Power_direct*antenna_gain(θ)+Power_reflected(θ)*antenna_gain(−θ)=
Power_direct*antenna_gain(θ)*(1+Reflection_coefficient(θ)).

Note that the above equality can be established, if only if:

antenna_gain(θ)=antenna_gain(−θ)

which is the symmetrical radiation pattern condition of many embodiments of the antenna 210.

Thus, the antenna 210 enables the first GNSS receiver chain 212 to receive (e.g., via the first port 220) a linearly polarized signal (e.g., a horizontally polarized signal) originating from a GNSS satellite that includes a set of direct and reflected components (Block 304). In some applications, a single linearly polarized signal (e.g., either a horizontally polarized signal or vertically polarized signal) may be used to obtain information about the environment. So, in some embodiments, the sensor 208 may only include a single receiver chain. But other applications require information obtained from two linearly polarized signals (that are orthogonal), and as a consequence, the antenna 210 may provide a second linearly polarized signal (e.g., via the second port 222) originating from the GNSS satellite where the second linearly polarized signal is orthogonal to the linearly polarized signal (Block 306).

The power at each of the antenna ports 220, 222 is routed to a respective one of the GNSS receiver chains 212, 214 through separated and isolated transmission lines (e.g. coaxial cable). Each of the GNSS receiver chains 212, 214 is further modified (e.g., through software) to provide a power measurement for each of the linearly polarized signals captured by the antenna 210 (Block 308). The modifications to obtain the power at a level of detectability/quality (e.g., that may be related to observable water) may entail the suppression of any:
  automatic gain control,
  anti-jamming filters
  multipath filters, and
  other proprietary filtering active in the commercial receivers.

The suppression of these processing techniques is counter to prior GNSS sensing approaches, and as a consequence, is not found in, or suggested by, typical GNSS receiver designs.

In addition to suppressing (the typically utilized) processing techniques, the GNSS receiver chains 212, 214 are modified to deliver power values at an enhanced level of precision. For example, each GNSS receiver chain 212, 214 may provide, via a navigation message, a precision power value characterizing a corresponding linearly polarized signal at a precision of at least 1/10 dB where typical GNSS receivers provide power values at a precision of 1 dB. In this way, a "true" power on both the "H polarization" and the "V polarization" may be inserted into dedicated receiver navigation messages that include one or more of the following:
  the time stamp,
  the satellite identification number,
  the position in azimuth and elevation, and
  the measured power.

In some variations, this information is delivered to the CPU 216 at a rate of, for example, 1 Hz and the CPU 216 may packetizing the parsed power values to produce packetized values for storage or transmission (e.g., to a cloud based server).

All this information may be processed locally and/or transmitted to the cloud via the communications module 218, which may be realized by a cellular network (although any other form of communication can be used).

During processing, the time stamped data is may be organized per satellite and per polarization to form pairs of a temporal series of interference signals as measured by the sensor. The data may be applied to many applications, but applications for measuring near-surface soil moisture, snow depth, and vegetation are described in the following publication, which is incorporated by reference in its entirety: Larson, KM, GPS interferometric reflectometry: applications to surface soil moisture, snow depth, and vegetation water content in the western United States, WIREs Water 2016. doi: 10.1002/wat2.1167.

Figure 4:
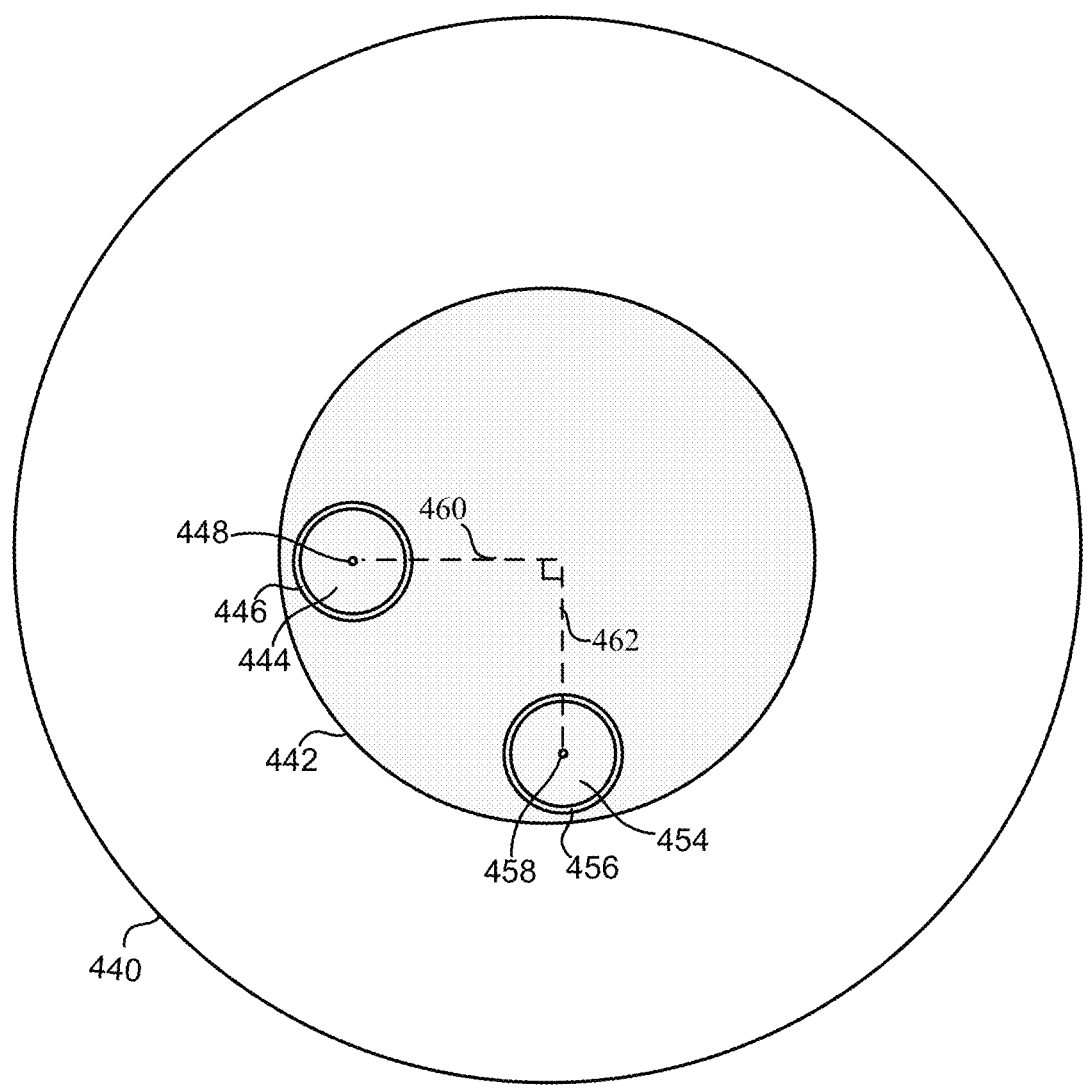
FIG. 4 depicts a patch antenna that may be used to realize the antenna depicted in FIG. 2.

Referring next to FIG. 4, shown is an example antenna that may be used to realize the antenna 210 described with reference to FIG. 2. The depicted antenna design enables a single two port antenna to simultaneously receive the two signals 102, 106 (combined into an interference signal) from any given satellite. The depicted antenna is designed with a phase center of both polarizations co-located inside one millimeter cube. As those of ordinary skill in the art appreciate, the phase center is the point from which the electromagnetic radiation spreads spherically outward, with the phase of the signal being equal at any point on the sphere.

The antenna depicted in FIG. 4 has two ports coupled to elements 444, 454 providing two orthogonal, linearly polarized signals. This is equivalent to having two virtual antennas of linear orthogonal polarizations embedded into one. An objective is to retrieve (measure) the projections of circularly polarized signals into linear orthogonal polarizations, so the two virtual antennas need to be collocated, which in an electromagnetic sense is done at the phase center location. The phase centers of both virtual antennas of linear orthogonal polarizations beneficially reside inside a 1 mm3 volume.

In addition, the antenna is tuned to the GNSS frequencies and bandwidth. The antenna design provides unique and unparalleled radiation characteristics for water measurements as well as a stable temperature performance for outdoors use (−40 C to +80 C).

As shown, the example antenna comprises a dielectric portion 440 and a patch portion 442 that is positioned on a surface of the dielectric portion 440 wherein both the dielectric portion 440 and the patch portion 442 are concentric and the patch portion 442 has a smaller diameter than the dielectric portion 440 so that the surface of the dielectric portion 440 is visible between an outer diameter of the patch portion 442 and the outer diameter of the dielectric portion 440. Also shown are a first element 444 and a second element 454 that may be formed from the same type of metal as the patch portion 442.

As shown, the first element 444 and the second element 454 may be circular in shape, and the first element 444 may include a first feed through 448 positioned at a center of the first element 444 to enable a conductor (e.g., a center conductor of a first coaxial cable) to be fed though a backside (not shown) of the dielectric portion 440 through the dielectric portion 440 and through the first element 448 so that the conductor may be coupled (e.g., by solder) to a surface of the first element 444. Similarly, the second element 454 may include a second feed through 458 positioned at a center of the second element 444 to enable a conductor (e.g., a center conductor of a second coaxial cable) to be fed though a backside (not shown) of the dielectric portion 440 through the dielectric portion 440 and through the second element 454 so that the conductor may be coupled (e.g., by solder) to a surface of the second element 454. A ground plane (not shown), which may be a similar size and shape as the dielectric portion may be parallel to the dielectric portion, and outer conductors of the first and second coaxial cables may be coupled to the ground plane.

The dielectric portion 440 is positioned between the patch portion 442 and the ground plane. As shown, the first element 444 and a second element 454 are positioned to be coplanar with the patch portion within a diameter of the patch portion, wherein the first and second elements 444, 454 are electrically isolated from the patch portion. The first port 220 is coupled to the first element 444 and the second port 222 is coupled to the second element 454, wherein the first element 444 is positioned relative to the second element 454 so that an angle of separation between the first element and the second element is 90 degrees. As shown, a diameter of the patch portion 442 is less than a diameter of the dielectric portion 440 and the first element 444 and second element 454 are positioned proximate to an outer diameter of the patch portion 442.

As shown, a first slit 446 separates the patch portion 442 from the first element 444 and a second slit 456 separates the patch portion 442 from the second element 454. More specifically, each of the first slit 446 and the second slit 456 is circular in shape to electrically separate the first element 444 and the second element 454 from the patch portion 442.

As depicted, the first element 444 is positioned relative to the second element 454 so that an angle of separation between the first element 444 and the second element 454 is 90 degrees.

Figure 5:
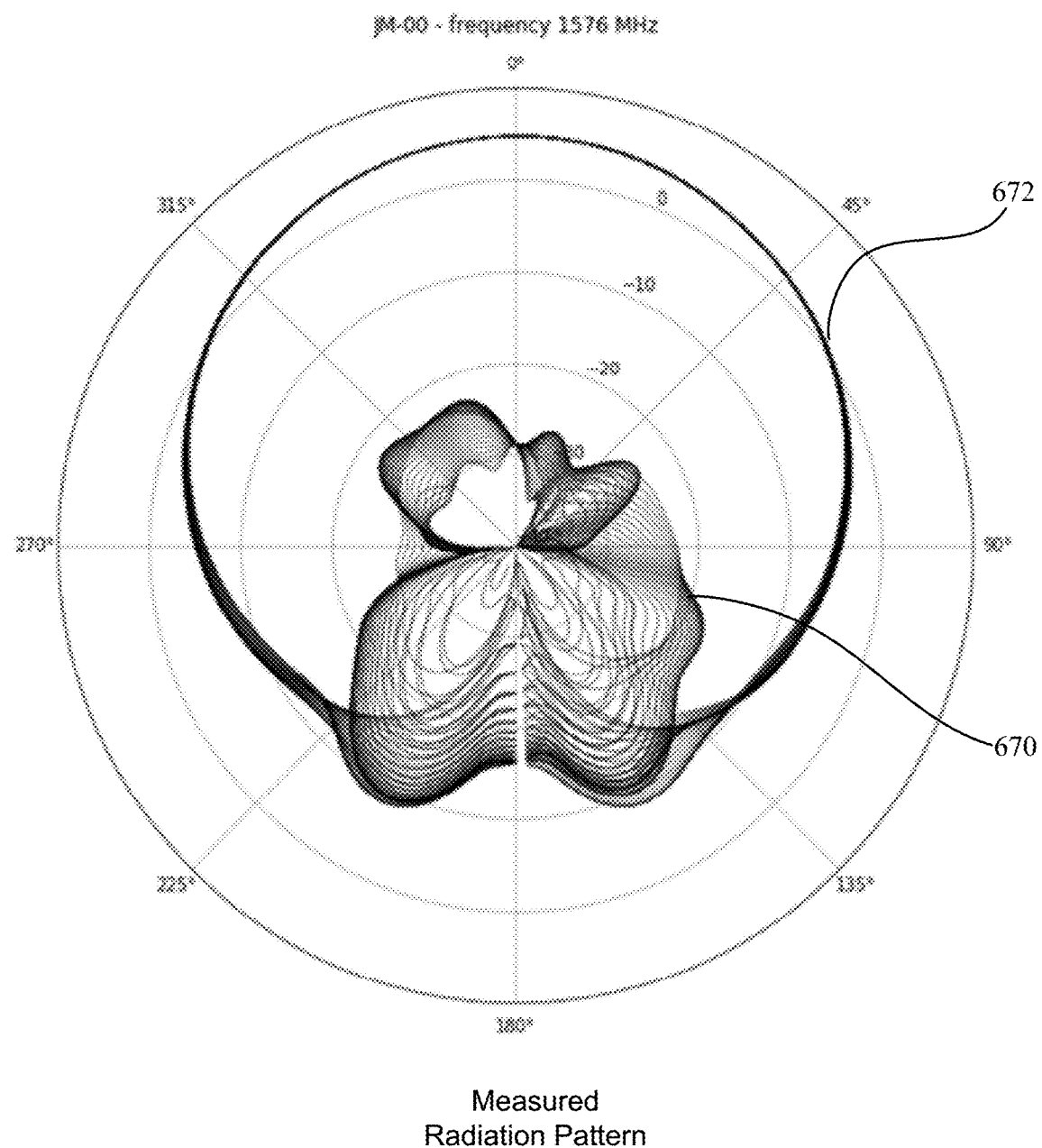
FIG. 5 depicts a measured radiation pattern for the patch antenna shown in FIG. 4.

Referring to FIG. 5, shown are actual measurements (where the radial scale is in dB) of a cross-polarization pattern 670 and a co-polarization pattern 672 produced by the antenna in FIG. 4. As shown in FIG. 5, the antenna design provides a very symmetrical co-polarization radiation pattern, i.e., a symmetrical antenna gain pattern. As a consequence, beneficially, antenna_gain($\theta$) substantially equals antenna_gain($-\theta$). In addition, the achieved isolation between co-polarization and cross-polarization pattern is ultra-high.

In connection with the sensor 208, the first element 444 may be coupled to the first GNSS receiver chain 212 via the first port 220 and the second element 454 may be coupled to the second GNSS receiver chain 214 via the second port 222. And in operation, the combined interference signal (produced from the combination of the RHCP signal 102 and the LHCP signal 106) impinges upon the patch portion 442 to produce electrical signals in the patch portion 442. In turn, the electrical signals are capacitively coupled to both the first element 444 and the second element 454 to effectuate the first linearly polarized signal and the second linearly polarized signal, which is orthogonal to the first linearly polarized signal. When the antenna depicted in FIG. 4 is positioned so that a horizontal line 460 that intersects a center of the first element 444 and a center of the patch portion 442 is substantially parallel with a surface under observation, the linearly polarized signal produced by the first element 444 is substantially horizontally polarized, and under this same antenna positioning, a vertical line 462 that intersects a center of the second element 454 and a center of the patch portion 442 is substantially perpendicular with the surface under observation, the linearly polarized signal produced by the second element 454 is substantially vertically polarized.

Although the antenna described with reference to FIGS. 4 and 5 provides a very symmetrical antenna gain pattern at a relatively low cost, it should be recognized that the antenna described with reference to FIGS. 4 and 5 is only an example of many potential antenna designs that may be used.

The methods described in connection with the embodiments disclosed herein may be carried out directly in hardware, in processor-executable code encoded in a non-transitory tangible processor readable storage medium, or in a combination of the two. In the context of the GNSS receiver chains, there are well known hardware platforms for down converting and processing GNSS signals to provide location information. Applicants have found that one approach to implementing the GNSS receiver chains 212, 214 is to utilize existing hardware while employing custom software to configure the hardware in a manner to suppress processing techniques (e.g., automatic gain control, anti-jamming filters, and other proprietary filtering) that would attenuate the power of the linearly polarized signals that are output by the antenna 210. More specifically, these typical processing techniques would attenuate the power of the linearly polarized signals to such an extent that critical information in the power levels of the linearly polarized signals would be lost in the inherent noise of the GNSS receiver chains 212, 214.

Figure 6:
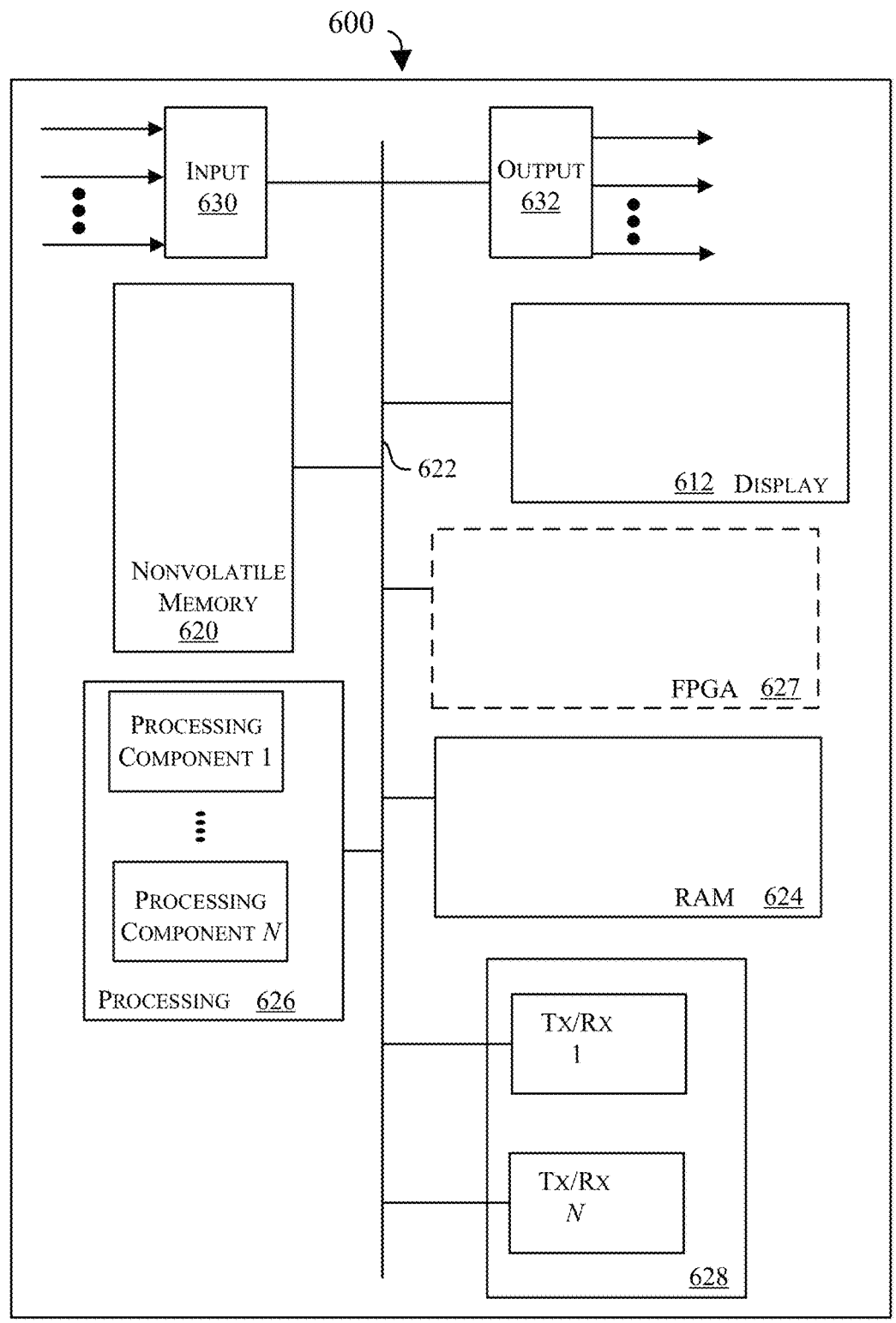
FIG. 6 is a block diagram depicting computing components that may be used in connection with the embodiments disclosed herein.

Referring to FIG. 6 shown is a block diagram depicting physical components 600 that may be utilized to realize the CPU 216 and communications module 218. And in some variations, the components depicted in FIG. 6 may also be utilized to realize one or more aspects of the GNSS receiver chains 212, 214. As shown, in this embodiment an optional display portion 612 and nonvolatile memory 620 are coupled to a bus 622 that is also coupled to random access memory ("RAM") 624, a processing portion (which includes N processing components) 626, an optional field programmable gate array (FPGA) 627, and a transceiver component 628 that includes N transceivers. Although the components depicted in FIG. 6 represent physical components, FIG. 6 is not intended to be a detailed hardware diagram; thus, many of the components depicted in FIG. 6 may be realized by common constructs or distributed among additional physical components. Moreover, it is contemplated that other existing and yet-to-be developed physical components and architectures may be utilized to implement the functional components described with reference to FIG. 6.

The optional display portion 612 generally operates to provide a user interface for a user, and in several implementations, the display is realized by a touchscreen display. In general, the nonvolatile memory 620 is non-transitory memory that functions to store (e.g., persistently store) data and processor-executable code (including executable code that is associated with effectuating the methods described herein). In some embodiments for example, the nonvolatile memory 620 includes bootloader code, operating system code, file system code, and non-transitory processor-executable code to facilitate the packetization and storage of the power information described herein.

In many implementations, the nonvolatile memory 620 is realized by flash memory (e.g., NAND or ONENAND memory), but it is contemplated that other memory types may be utilized as well. Although it may be possible to execute the code from the nonvolatile memory 620, the executable code in the nonvolatile memory is typically loaded into RAM 624 and executed by one or more of the N processing components in the processing portion 626.

The N processing components in connection with RAM 624 generally operate to execute the instructions stored in nonvolatile memory 620 to enable the storage and packetization of power values, timestamp, satellite ID, etc. For example, non-transitory, processor-executable code to effectuate the methods described with reference to FIG. 3 may be persistently stored in nonvolatile memory 620 and executed by the N processing components in connection with RAM 624. As one of ordinarily skill in the art will appreciate, the processing portion 626 may include a video processor, digital signal processor (DSP), micro-controller, graphics processing unit (GPU), or other hardware processing components or combinations of hardware and software processing components (e.g., an FPGA or an FPGA including digital logic processing portions).

The input component 630 operates to receive signals (e.g., the power value signals) that are indicative of power levels of the linearly polarized signals. The output component 632 may be used to provide digital or analog signals indicative of one or more parameter values within the signal logger system, The depicted transceiver component 628 includes N transceiver chains, which may be used for communicating with external devices via wireless or wireline networks. Each of the N transceiver chains may represent a transceiver associated with a particular communication scheme (e.g., WiFi, Ethernet, cellular network etc.). The transceiver component 628 enables the sensor 208 to communicate power information about the linearly polarized signal to remote processing center(s) such as cloud-base processing centers.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for logging data comprising:
   receiving direct right hand and reflected left hand circularly polarized components at an antenna, the direct right hand and reflected left hand circularly polarized components originating from a satellite;
   converting, with the antenna, the direct right hand and reflected left hand circularly polarized components into a first linearly polarized signal and a second linearly polarized signal, the first linearly polarized signal and the second linearly polarized signal each comprising a set of direct and reflected components, and the second linearly polarized signal is orthogonal to the first linearly polarized signal;
   obtaining a first power value for the first linearly polarized signal at a precision of at least 1/10 dB;
   obtaining a second power value for the second linearly polarized signal at a precision of at least 1/10 dB; and
   packetizing the first and second power values for storage or transmission.

2. The method of claim 1, wherein the first linearly polarized signal is a horizontally polarized signal and the second linearly polarized signal is a vertically polarized signal.

3. The method of claim 2, wherein obtaining the power values does not include adding automatic gain control, anti-jamming filters, or multipath filters.

4. The method of claim 1 comprising transmitting the packetized values to a cloud-based server.

* * * * *